United States Patent [19]
Hikida

[11] Patent Number: 5,273,912
[45] Date of Patent: Dec. 28, 1993

[54] METHOD FOR MANUFACTURING SEMICONDUCTOR DEVICE

[75] Inventor: Satoshi Hikida, Nara, Japan

[73] Assignee: Sharp Kabushiki Kaisha, Osaka

[21] Appl. No.: 921,010

[22] Filed: Jul. 28, 1992

[30]  Foreign Application Priority Data

Aug. 12, 1991 [JP] Japan .................................. 3-202020

[51] Int. Cl.$^5$ ........................................ H01L 21/265
[52] U.S. Cl. ...................................... 437/31; 437/26; 437/74; 437/76; 437/154
[58] Field of Search .................... 437/75, 76, 26, 154, 437/74, 31, 909; 148/DIG.

[56]  References Cited

U.S. PATENT DOCUMENTS 4,637,125  1/1987  Iwasaki et al. ........................ 437/76
4,965,220 10/1990  Iwasaki .................................. 437/76

Primary Examiner—Brian A. Hearn
Assistant Examiner—Tuan Nguyen
Attorney, Agent, or Firm—Nixon & Vanderhye

[57]  ABSTRACT

A method for manufacturing a semiconductor device including forming an epitaxial layer on a second conductive silicon substrate selectively provided with a first conductive impurity diffusion layer and diffusing a second impurity through surface of the epitaxial layer to form islands of the epitaxial layer, the above epitaxial layer having a higher specific resistance than that of the silicon substrate.

5 Claims, 2 Drawing Sheets

FIG.1
FIG.1(a)
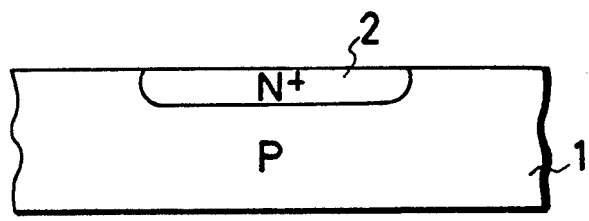
FIG.1(b)
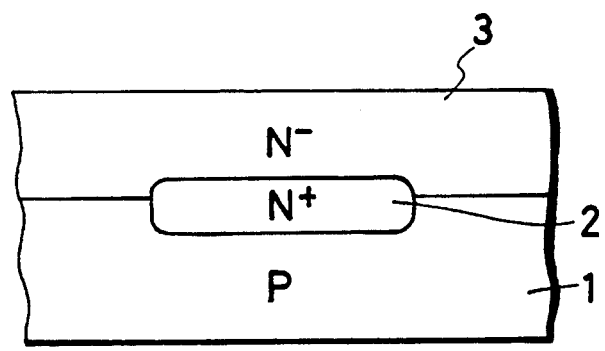
FIG.1(c)
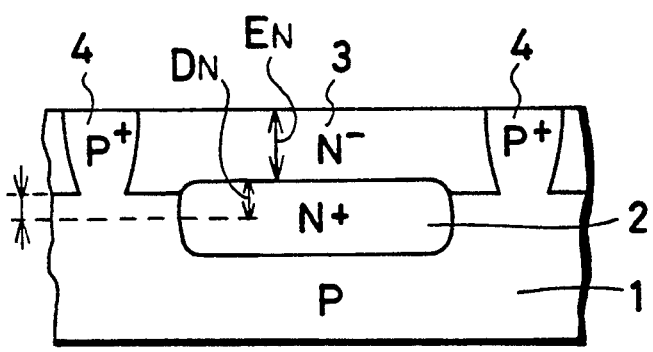

METHOD FOR MANUFACTURING SEMICONDUCTOR DEVICE

BACKGROUND OF THE INVENTION

Field of the Invention

The present invention relates to a method for manufacturing semiconductor devices, and more particularly to a method for manufacturing improved bipolar integrated circuits.

Description of the Related Art

Technical development is being made to realize a bipolar IC of higher integration density and less power consumption.

FIG. 2 is a schematic section showing a bipolar IC manufactured by a conventional method described below.

Firstly, arsenic or antimony is diffused by thermal diffusion in a patterned part (not shown) of a P-type Si substrate 10 having a specific resistance of 10 to 20 $\Omega$.cm to form a N+ diffusion layer 11. A N− epitaxial layer 13 is then grown on the P-type Si substrate 10 including the N+ diffusion layer 11. In turn a P-type impurity such as boron ion or the like is diffused by thermal diffusion to form a P+ isolation diffusion layer 14, thereby forming an island in the N− epitaxial layer 13. This thermal diffusion allows the N+ impurity of the diffusion layer 11 to re-diffuse upwardly by a height $D_o$ into the epitaxial layer 13.

For rendering the bipolar IC highly pressure-resistant, the impurity concentration of the N-type epitaxial layer 13 needs to be lowered to increase the specific resistance thereof or the layer 13 itself needs to be made thick. However, the N-type epitaxial layer 13 with an increased specific resistance would widen a depletion layer, causing reach through with the layer 11. Otherwise, the thickened N-type epitaxial layer 13 would require lengthy impurity diffusion at high temperature to be isolated. In this case, the isolation diffusion regions grow laterally, causing a transistor to be oversized. In addition, the upward diffusion of the N+ layer 11, or the height $D_o$ is so increased that a thickness $E_o$ of the emitter-effective epitaxial layer 13 upon which the dielectric strength of the transistor depends would be substantially decreased, accordingly.

Some methods to solve these problems are conventionally adopted, for example, trench isolation, two-step isolation and a like method. According to the trench isolation, devices are isolated from each other by forming a trench and refilling it with an insulating film. On the other hand, according to the two-step isolation, a P+-type buried layer 25 is previously provided in a region intended to be an isolation diffusion region, as shown in FIG. 3. With this method, the thickness (represented by B in FIG. 3) of the P+ layer 24 to be diffused for isolation and can be decreased by about half the entire thickness of the epitaxial layer 23 so that the duration of heat treatment at high temperature is rather shortened. Accordingly, the upward diffusion represented by A in FIG. 3 of the N+ layer 21 can be substantially suppressed. In addition the thickness of the effective epitaxial layer 23 represented by C in FIG. 3 can be prevented from reducing.

Alternatively, there is a method in which a P-epitaxial layer 35 is first grown on a Si substrate 30, followed by stacking thereon a N-type epitaxial layer 33, as shown in FIG. 4. With this method, the duration of diffusion for isolation can be shortened by the period of time for forming the P− epitaxial 35.

Nevertheless, the above prior art methods involve increased manufacturing processes, thus raising production cost.

SUMMARY OF THE INVENTION

The present invention is to provide an improved method for manufacturing semiconductor devices, by which method an epitaxial layer is isolated more quickly while assuring a sufficient effective epitaxial layer without increasing manufacturing processes in number or production cost.

The present invention provides a method for manufacturing a semiconductor device comprising the steps of: forming selectively an impurity diffusion layer of a first conductivity type in a silicon substrate of a second conductivity type; growing on the silicon substrate an epitaxial layer having a specific resistance higher than the substrate does; and diffusing an impurity of the second conductivity type into the epitaxial layer so as to form an island in the epitaxial layer.

BRIEF DESCRIPTION OF THE DRAWINGS

FIG. 1(a), 1(b), 1(c) is a schematic representation illustrating how a semiconductor device is manufactured according to an example of the invention.

DETAILED DESCRIPTION OF THE PREFERRED EMBODIMENTS

Figure 2:
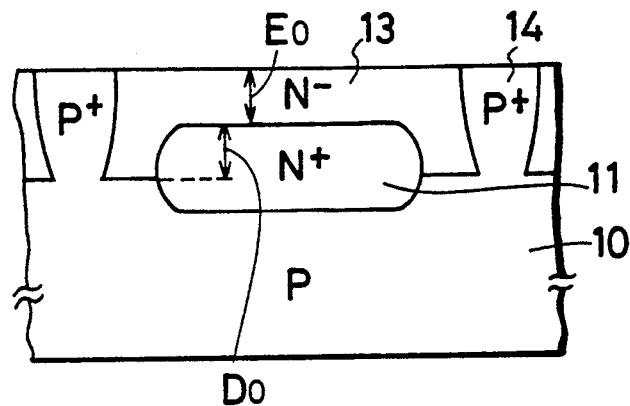
FIG. 2 is a schematic section showing a main structure of a conventional semiconductor device.
Figure 3:
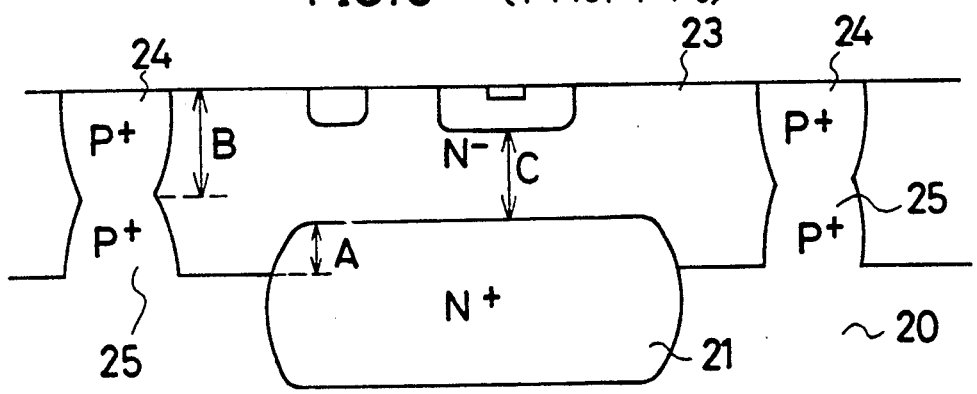
FIG. 3 is a schematic section showing a main structure of a semiconductor device manufactured according to a conventional two-step isolation method.
Figure 4:
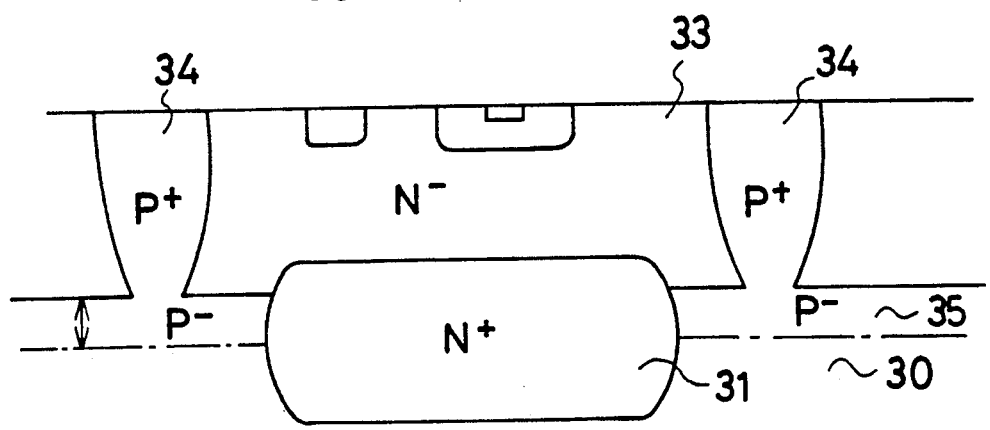
FIG. 4 is a schematic section showing a main structure of a semiconductor device manufactured according to a conventional P-epitaxial stacking method.

A silicon substrate in the invention contains an impurity of a conductivity type, P- or N-type. In a preferred embodiment the substrate contains a P-type impurity which is diffused therein in a dose of $10^{15}$ to $10^{16}$ atoms/cm$^3$. The substrate has a specific resistance of about 10 $\Omega$.cm or less, preferably about 5 $\Omega$.cm or less, more preferably about 2 $\Omega$.cm to about 3 $\Omega$.cm. If the specific resistance of the P-type silicon substrate is too low, an isolation breakdown voltage at the interface between the silicon substrate and a N+ buried layer is apt to become undesirably low; and particularly if it is less than 1 $\Omega$.cm, a P-type inversion layer is produced on the N+ buried layer, increasing collector resistance and decreasing isolation breakdown strength undesirably. In the present invention, an impurity of a different conductivity type from that of the silicon substrate is selectively diffused in a dose of $10^{20}$ to $10^{21}$ atoms/cm$^3$ into the silicon substrate. In turn an epitaxial layer having a higher specific resistance than that of the silicon substrate is grown on the substrate. The epitaxial layer is doped with an impurity of the same conductivity type as that of the buried layer in a dose of $4 \times 10^{14}$ to $1 \times 10^{15}$ atoms/cm$^3$. Making the epitaxial layer having a specific resistance higher than the substrate causes the isolation breakdown strength to increase. The specific resistance of the epitaxial layer is set to more than 10 $\Omega$.cm when the substrate has 10 $\Omega$.cm or less of specific resistance, preferably to more than 5 $\Omega$.cm when the substrate has 5 $\Omega$.cm or less of specific resistance, more preferably to about 6 Ω.cm when the substrate has about 2-3 Ω.cm of specific resistance. The more the specific resistance increases, the broader the depletion layer grows. Accordingly, the epitaxial layer needs to be made thicker and hence the transistor size is inevitably enlarged. Thus, great care must be taken so as not to increase the specific resistance of the epitaxial layer too much. The isolation breakdown strength of a transistor depends on the thickness of effective epitaxial layer. So, it is desirable that the thickness of the epitaxial layer should be made sufficient but the thinnest possible, for example, 15 μm to 17 μm, preferably 15.5 μm to 16.5 μm, more preferably about 16.0 μm while at the same time the upward diffusion of the N+ buried layer should be inhibited to a minimum. The epitaxial layer can be grown with its specific resistance adjusted by a well-known method. For example, the epitaxial layer is grown by a CVD process, by reducing $SiCl_4$ with $H_2$ at normal pressure and about 1000° to about 1200° C., for example, 1160° C. It takes about 20 to about 30 mins., for example, 26 mins. to grow the epitaxial layer to 16.0 μm thick whose specific resistance can be controlled by appropriately adding $PH_3$ diluted with $H_2$ thereto.

In turn an impurity of the same conductivity type as that of the silicon substrate is diffused from surface of the epitaxial layer to form an isolation diffusion layer, with the result that an island is formed in the epitaxial layer. In the case where the substrate is of P-type conductivity, the isolation diffusion layer is formed by implanting a P-type impurity such as boron ion in a dose of $10^{15}$ to $10^{16}$ ions/cm$^2$ and diffusing the impurity by heat treatment of which period is preferably restricted as short as possible, for example, 60 to 200 mins. at 1150° to 1200° C.

After making the island, regions for collector, base and emitter are formed, followed by formation of electrodes for collector, base and emitter in accordance with a well-known transistor manufacturing method. Thus, a semiconductor device is completed.

As described above, the present invention sets the specific resistances of the P-type silicon substrate and the epitaxial layer to 2-3 Ω.cm and 6 Ω.cm, respectively, the thickness of the epitaxial layer to 16.0 μm, and the duration of diffusion for isolation is for 100 mins., the collector-emitter breakdown voltage, base open ($_BV_{CEO}$) of the NPN transistor can exceed 65 V, the isolation breackdown voltage can be raised to 70 V or more; and the P inversion layer is not produced. In addition incerase in transistor size can be suppressed.

The semiconductor manufacturing method according to the present invention will hereinbelow be explained with reference to FIG. 1.

Referring to FIG. 1(a), a $SiO_2$ film (not shown) is formed on a P-type silicon substrate 1 and a window is opened in that film. Through the window, phosphorus ion as N-type impurity is selectively implanted in a dose of $1 \times 10^{16}$ ions/cm$^2$ at 40 keV and diffused to form a N+ diffusion layer 2 in the substrate. As the P-type silicon substrate 1 used is a substrate having a resistivity of 2 to 3 Ω.cm, which value is much lower than that of an epitaxial layer 3 referred to later.

Referring to FIG. 1(b), after removal of the $SiO_2$ film a N− epitaxial layer 3, its dose was about $8 \times 10^{14}$ atoms/cm$^3$ and thickness about 16.0 μm, is grown all over the P-type silicon substrate 1. The N− epitaxial layer 3 exhibits a specific resistance 6 Ω.cm.

Referring to FIG. 1(c), boron ion as a P-type impurity is then selectively implanted into the N− epitaxial layer, and diffused by a heat treatment at 1200° C. for about 100 mins. to form a P+ isolation diffusion layer 4. The P+ isolation diffusion is conducted at a high temperature so that the N+ diffusion layer 2 formed prior to the growth of the epitaxial layer 3 is re-diffused upwardly by a height $D_N$ into the epitaxial layer 3. At the same time therewith, the P-type impurity in the silicon substrate 1 was diffused upwardly by a height $D_S$ into the epitaxial layer 3 because of the difference in impurity concentration between the two. As a result the diffusion period for forming the P+ isolation diffusion layer 4 is reduced.

Lastly, collector, base and emitter regions are formed in a well-known manner, then electrodes for collector, base and emitter are repectively formed to complete a semiconductor device.

As described above, according to the present invention, isolation diffusion is performed more quickly than ever because the epitaxial layer in which the isolation diffusion layer is formed is made thinner. Reduction of isolation diffusion period causes the N+ diffusion buried layer not to diffuse upward so much. Consequently the effective epitaxial layer beneath the emitter can be made relatively thick ($E_N$ in FIG. 1), rendering the intended device highly resistant.

In the present invention, an epitaxial layer of a relatively low specific resistance is grown on a silicon layer of relatively low specific resistance. This feature of the invention enables to fabricate a semiconductor device in which an effective epitaxial layer is made sufficiently thick to assure high-resistant properties without using a number of uneconomic processes.

What we claim is:

1. A method for manufacturing a semiconductor device comprising the steps of:
    forming selectively an impurity diffusion layer of a first conductivity type in a silicon substrate of a second conductivity type;
    growing on the silicon substrate an epitaxial layer having a specific resistance higher than the substrate; and
    diffusing an impurity of the second conductivity type from a surface of the epitaxial layer to form an isolation diffusion layer, thereby forming an island in the epitaxial layer, and thereby essentially simultaneously causing
    (1) the impurity of the second conductivity type in the silicon substrate to diffuse upwardly into the epitaxial layer, and
    (2) the impurity of the first type of the impurity diffusion layer to diffuse upwardly into the epitaxial layer,
    the extent of the diffusion of the impurity of the first type of the impurity diffusion layer into the epitaxial layer being less than the extent of the diffusion of the impurity of the second conductivity type in the silicon substrate into the epitaxial layer.

2. A method as set forth in claim 1, wherein said epitaxial layer has a specific resistance of more than 10 Ω.cm, while the substrate has a specific resistance of 10 Ω.cm or less.

3. A method as set forth in claim 1, wherein said epitaxial layer has a specific resistance of more than 5 Ω.cm, while the substrate has a specific resistance of 5 Ω.cm or less.

4. A method as set forth in claim 1, wherein said epitaxial layer has a specific resistance of about 6 Ω.cm, while the substrate has a specific resistance of about 2 Ω.cm to about 3 Ω.cm.

5. A method as set forth in claim 1, wherein said epitaxial layer is grown to a thickness of 15 to 17 μm.

* * * * *